United States Patent [19]

Yamawaki et al.

[11] 4,075,972

[45] Feb. 28, 1978

[54] APPARATUS FOR THERMAL DIFFUSION OF SEMICONDUCTOR DEVICES

[75] Inventors: Masao Yamawaki, Handa; Katsuo Aoki, Aichi; Osamu Ina, Okazaki; Takao Suzuki, Kariya; Yoshio Oka, Toyota; Kunihiko Hara, Kariya, all of Japan

[73] Assignee: Nippondenso Co., Ltd., Kariya, Japan

[21] Appl. No.: 714,806

[22] Filed: Aug. 16, 1976

[30] Foreign Application Priority Data

Aug. 20, 1975 Japan .................................. 50-100863
Oct. 1, 1975 Japan .................................. 50-119135
Oct. 30, 1975 Japan .................................. 50-131025

[51] Int. Cl.² .......................................... C23C 13/12
[52] U.S. Cl. ......................... 118/6; 118/49.1; 118/500; 214/1 BB; 427/248 G; 432/253
[58] Field of Search .............. 118/6, 48, 49, 49.1, 118/49.5, 50.1, 58, 500; 148/189; 427/248 R, 248 G, 294, 295; 432/239, 253, 258, 86, 261, 126; 23/277 R, 288 J, 288 M; 211/41; 214/1 BB, 152

[56] References Cited

U.S. PATENT DOCUMENTS

| | | | |
|---|---|---|---|
| 3,051,811 | 8/1962 | Koesling | 432/126 X |
| 3,202,406 | 8/1965 | Tack | 432/239 |
| 3,473,510 | 10/1969 | Sheng et al. | 118/49.5 |
| 3,645,545 | 2/1972 | Garnache et al. | 118/49 |
| 3,710,757 | 1/1973 | Porter | 118/48 |
| 3,744,650 | 7/1973 | Henebry et al. | 432/239 X |
| 3,811,825 | 5/1974 | Enderlein | 432/253 X |
| 3,819,067 | 6/1974 | Hammond | 432/253 |
| 3,951,587 | 4/1976 | Alliegro et al. | 432/253 |
| 3,982,888 | 9/1976 | Moussou et al. | 432/253 X |

*Primary Examiner*—Mervin Stein
*Attorney, Agent, or Firm*—Cushman, Darby & Cushman

[57] ABSTRACT

The invention discloses an apparatus for thermal diffusion of semiconductor devices, wherein a plurality of wafer boats each made of a refractory material and adapted to carry a predetermined number of wafers to be processed are sequentially fed into a furnace tube containing a high temperature, diffusion gas atmosphere and continuously transported at a predetermined speed through the furnace tube so that each wafer may have substantially the same thermal treatment and high productivity may be attained.

12 Claims, 31 Drawing Figures

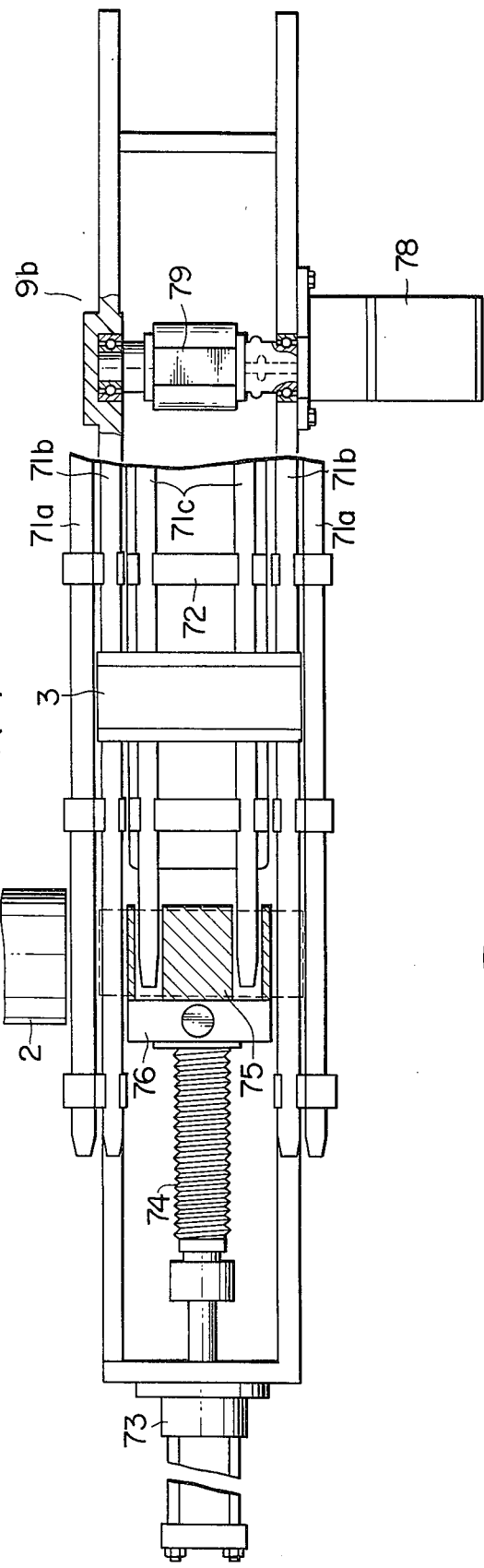
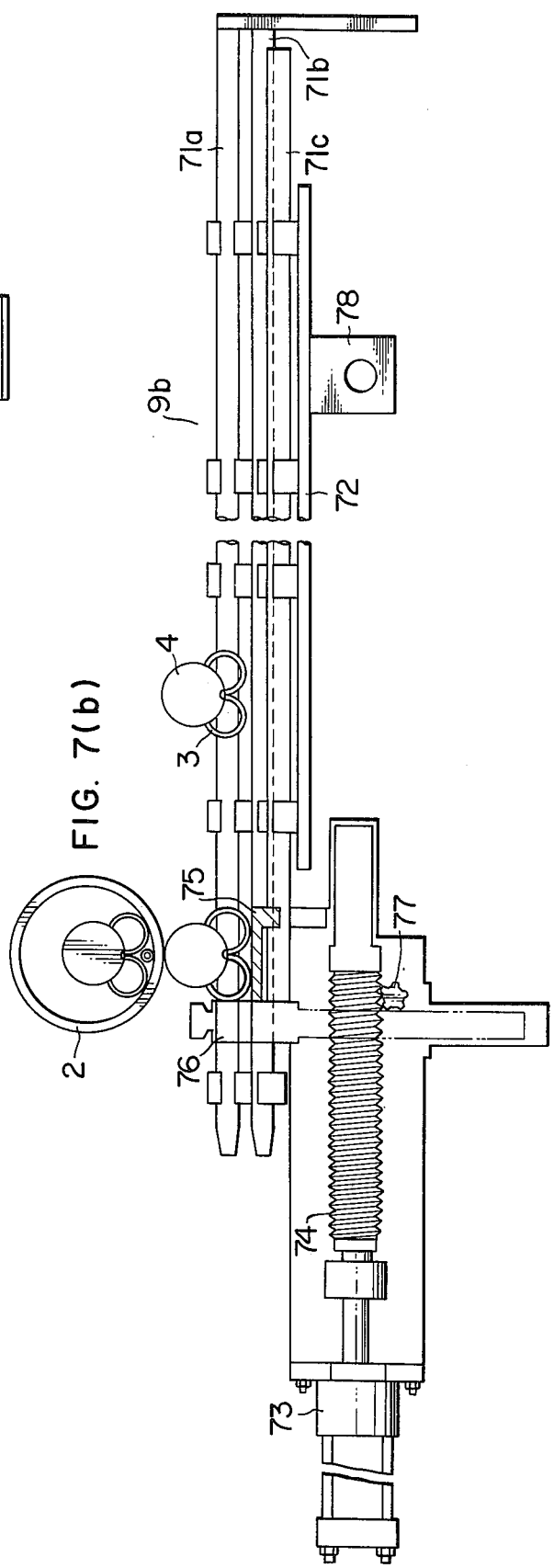
FIG. 7(a)
FIG. 7(b)

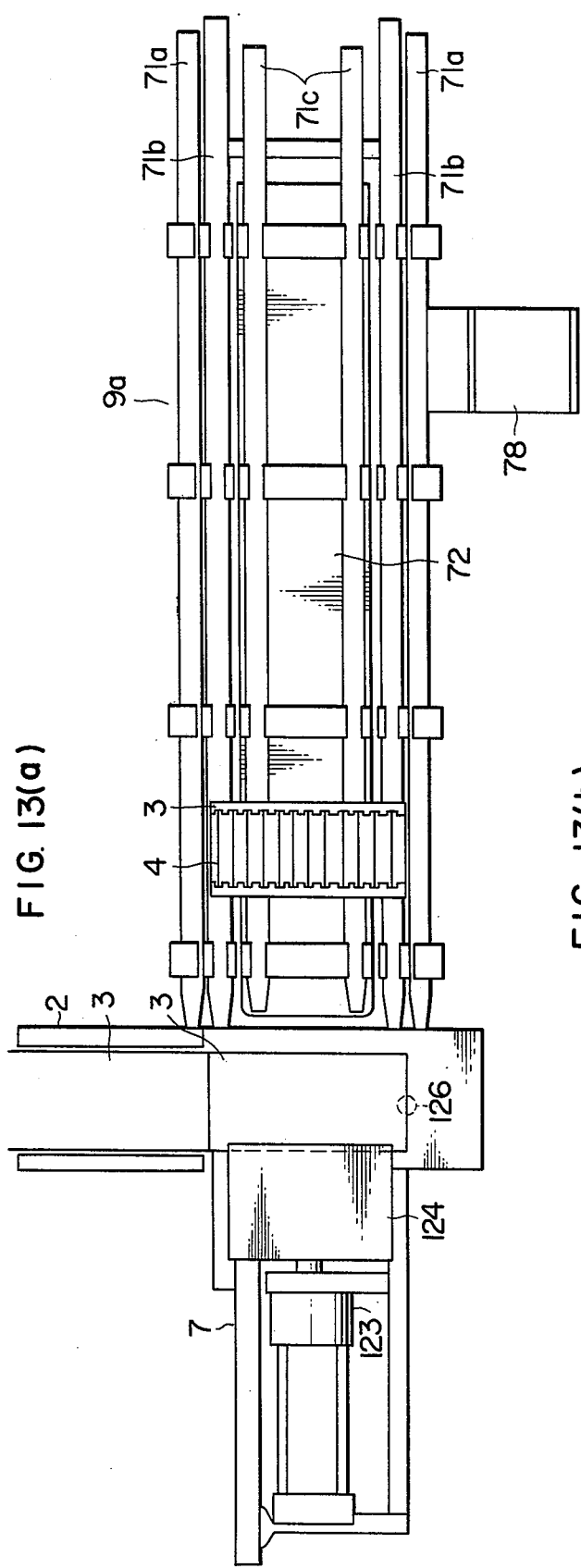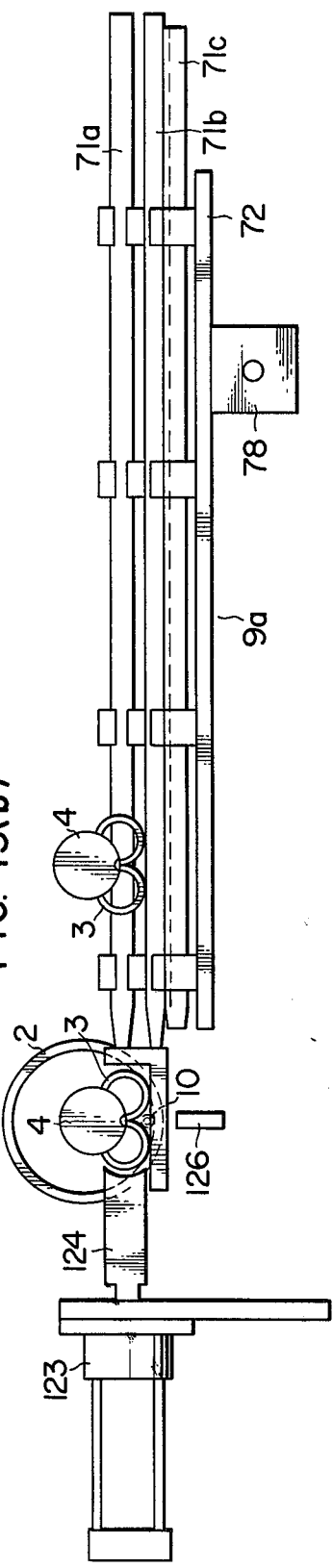
FIG. 13(a)
FIG. 13(b)

APPARATUS FOR THERMAL DIFFUSION OF SEMICONDUCTOR DEVICES

BACKGROUND OF THE INVENTION

The present invention relates to an apparatus for thermal diffusion of semiconductor devices so that semiconductor devices with uniform quality may be mass produced.

It has been well known in the art that in the process for fabrication of semiconductor devices such as diodes, transistors and the like by doping various impurity elements into substrates of a silicon semiconductor or the like, thermal diffusion methods have been widely used to diffuse the impurities into the substrates (hereafter merely denote as wafers). The prior art apparatus for carrying out the diffusion process includes a diffusion furnace such as an electric furnace which is controlled with a higher degree of accuracy to minimize temperature variation in the diffusion furnace. In general, the prior art diffusion furnace includes a furnace tube made of quartz of the like and extended through the diffusion furnace, and a plurality of wafers to be processed are placed in a predetermined position within the furnace tube and kept for a required length of time at a predetermined temperature for diffusion. More particularly wafer boats each made of a refractory material such as quartz or graphite and adapted to carry a predetermined number of wafers to be processed are arrayed and inserted into a furnace tube to be placed in a predetermined position, and after being kept for a predetermined diffusion time, the boats are withdrawn from the furnace tube when the thermal diffusion of the wafers is completed. Depending upon the required extent of diffusion, a suitable gas such as nitrogen or oxygen gas is introduced into the furnace tube from one end thereof to maintain a required high temperature atmosphere.

The electrical characteristics of semiconductor devices such as diodes, transistors or the like fabricated by the diffusion of impurity elements into semiconductor wafers are, in general, much influenced by the concentration and the depth of penetration of impurities into wafers which in turn are dependent upon the temperature of the diffusion atmosphere in which the wafers are placed. Therefore unless the diffusion temperature is controlled with a higher degree of accuracy, the required electrical characteristics of semiconductor devices cannot be obtained. In general, in the thermal diffusion apparatus used in the process for fabricating semiconductor devices, the temperature variation in a furnace tube of a diffusion tube must be controlled within ± 0.5° C of a setting temperature. Meanwhile when the number of semiconductor wafers to be inserted into a furnace tube is increased, the length of a controlled space must be increased, accordingly.

However, when the construction of a heater and a control system are taken into account a volume or space which may be effectively used in practice for diffusion of wafers, the increase in length of a diffusion zone is not economical, resulting in large size and high construction and operation costs of a diffusion apparatus. Consequently, the manufacturing costs of a semiconductor device are inevitably increased.

The electrical characteristics of semiconductor devices fabricated by thermal diffusion are greatly dependent not only on the temperature of the atmosphere, the concentration and depth of penetration of impurities but also on the crystal structures of wafers to be processed. For instance, when the concentration and penetration depth are the same but the speed with which wafers are inserted into and withdrawn out of a high temperature furnace tube or diffusion zone is different, thermal shock exerted to each wafer may differ, thus resulting in a difference in crystal structure. Consequently the electrical characteristics are different from each other. In the fabrication of well known planar semiconductor devices, the residual stress distribution at the interface between an oxide film and a semiconductor crystal varies depending upon the speed at which a wafer is inserted into and withdrawn out of high temperature diffusion zone. As a result, the variation in electrical characteristics occur with the resultant considerable decrease in yield rate.

As described above, according to the prior art thermal diffusion processes and apparatus, not only the lot variation; that is, the variation in electrical characteristics among the wafers in each lot or batch due to the unstable temperature and atmosphere distribution or gradient within the furnace tube or diffusion zone but the variation in electrical characteristics among the lots or batches due to the difference in operating conditions including the condition under which each batch is inserted into and withdrawn out of the furnace tube or diffusion zone, cannot be eliminated or minimized. To overcome these problems many attempts and efforts have been made, but so far no satisfactory means has been proposed yet.

In general, the thermal diffusion process comprises a cleaning step, a drying step and a diffusion step, and apparatus for automatically carrying out the cleaning and drying steps have quite recently been introduced, but the diffusion step still remains a batch operation. The full automation of the thermal diffusion process cannot be attained without the automation of the diffusion step, and consequently the large-scale mass production of semiconductor devices cannot be attained.

In view of the above, one of the objects of the present invention is to provide a process and apparatus for thermal diffusion of semiconductor wafers, wherein a plurality of wafer boats each made of a refractory material and adapted to carry a predetermined number of wafers to be processed are continuously transported in line through a high temperature, thermal diffusion zone or a furnace tube so that each wafer may experience substantially the same thermal history and consequently wafers with a minimum variation in characteristics may be mass produced on a large scale.

The present invention will become more apparent from the following description of one preferred embodiment thereof taken in conjunction with the accompanying drawings.

BRIEF DESCRIPTION OF THE DRAWINGS

FIG. 7(a) is a top view of a first mechanism or wafer boat transfer device for transferring a wafer boat to the loading position adjacent the inlet end of the furnace tube;

FIG. 7(b) is a side view thereof;

FIG. 13(a) is a top view of a third mechanism for transporting a wafer boat discharged out of the furnace tube to a predetermined position;

FIG. 13(b) is a side view thereof; and

DESCRIPTION OF THE PREFERRED EMBODIMENT

Figure 1:
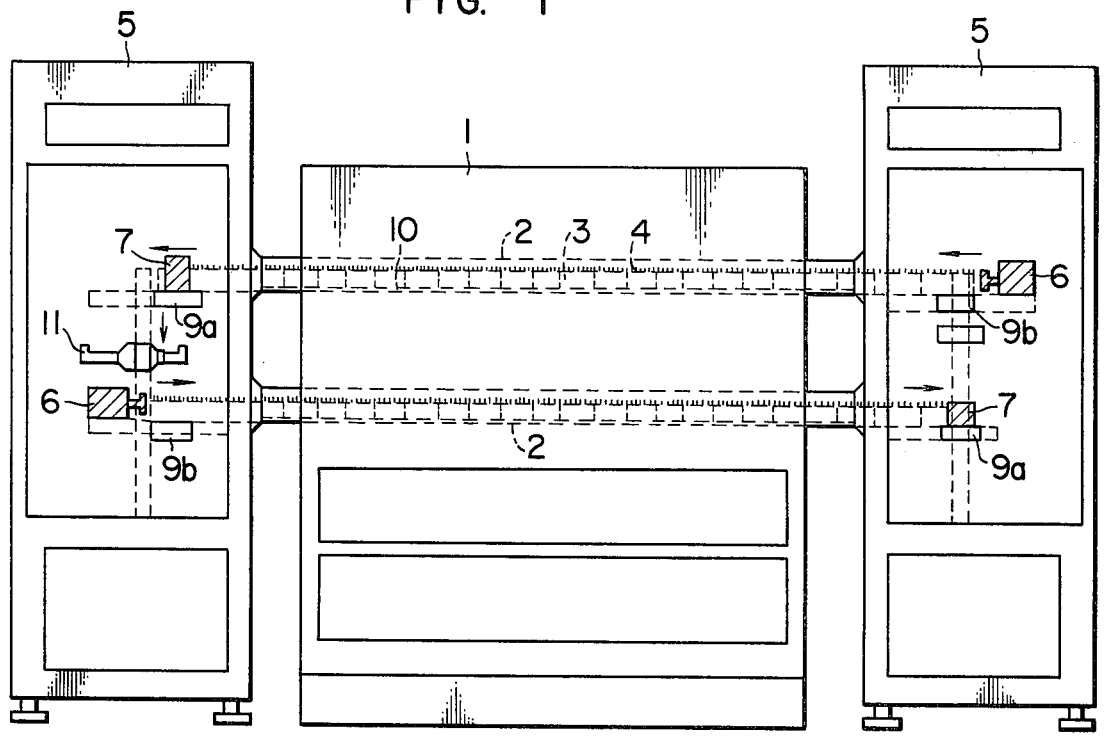
FIG. 1 is a front view of a thermal diffusion apparatus in accordance with the present invention.
Figure 2:
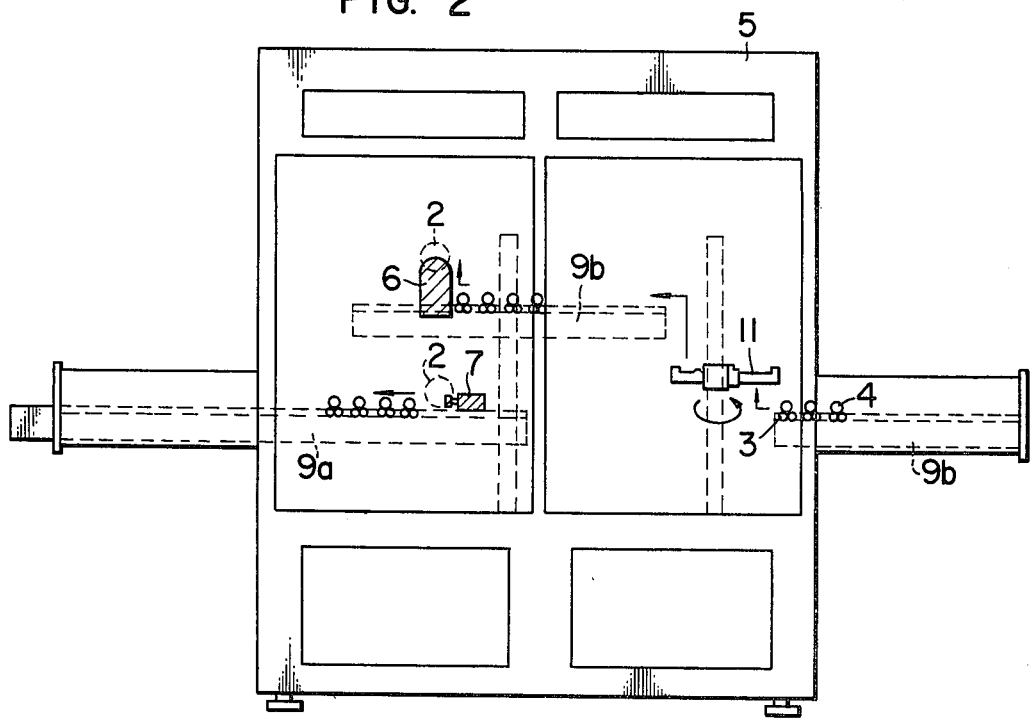
FIG. 2 is a right side view thereof illustrating the transfer of wafer boats in a right clean box or chamber.

In FIGS. 1 and 2 which show a general construction of the thermal diffusion apparatus in accordance with the present invention there is shown an electric diffusion furnace 1 of the conventional type incorporating two vertically spaced furnace tubes 2 in each of which the diffusion temperature is precisely controlled at a predetermined level. An automatic wafer boat loading and unloading device for automatically loading a wafer boat 3 into one of the furnace tubes 2 and unloading it from the other furnace tube 2 in order to prevent the contamination of wafers 4 carried by the boats 3 throughout the whole passage thereof is disposed within each clean box 5 which is located on each side of the diffusion furnace 1 and is air-tightly communicated with the furnace tubes 2.

A loading device 9b is adapted to automatically array in line the boats 3 each carrying a number of wafers 4 and feed them one by one toward the furnace tube 2 as best shown in FIG. 2. More particularly, when the first boat 3 has been transported to a predetermined loading position by the loading device 9b in the right clean box 5, a pusher mechanism 6 including a pulse or stepping motor (not shown) in the right clean bos 5 is actuated in response to the control signal to insert the first boat 3 into the upper furnace tube 2 at a predetermined speed over a predetermined distance. Thereafter the second wafer boat 3 is brought to the loading position and then inserted into the upper furnace tube 2 in the same manner and in such a way that the leading end of the second boat 3 may be made into direct contact with the trailing end of the first boat 3. In like manner, the wafer boats 3 are sequentially inserted into the upper furnace tube 2.

When the first wafer boat 3 has passed through and been discharged from the upper furnace tube 2, a loading device 7 in the left clean box 5 is actuated to automatically array it on a boat stocker 9a which is a transfer device disposed in the left clean box 5. The wafer boats 3 which have been arrayed on the upper stocker 9a is sequentially transferred by a wafer boat transfer device or loader 11 onto the lower boat stocker 9b and arrayed in line. Thereafter the wafer boats 3 are sequentially inserted into the lower furnace tube 2 by the pusher mechanism 6 in the manner described above with reference to the pusher mechanism 6 in the right clean box 5, and are transported through the tube 2 toward the right clean box 5.

The diffusion apparatus in accordance with the present invention, thus is capable of performing continuous wafer treatment for a long period of time and may satisfy various desired diffusion conditions when a plurality of the apparatus are combined. So far the wafers 4 carried by the boats 3 have been described as being transported through the upper furnace tube 2 from the right clean box 5 to the left clean box 5 and then being returned through the lower furnace tube 2 to the right clean box 5, but it will be understood that the wafer boats 3 may be passed only through the furnace tube 2 from the right clean box 5 to the left clean box 5 or vice versa.

In summary, the diffusion apparatus in accordance with the present invention for used in the process for fabrication of semiconductor devices comprises;

1. a first mechanism for sequentially transporting a plurality of boats which are made of a heat-resisting material and each of which carries a number of wafers to be treated without causing any contamination and breakage of the wafers to the entrance of a diffusion zone containing an atmosphere at a predetermined temperature high enough for carrying out the thermal diffusion of desired dopants or impurities into the wafers.

2. A second mechansim for sequentially transporting said plurality of wafer boats from the inlet to the outlet of said zone containing the high temperature thermal diffusion atmosphere so that each of the wafers may have substantially the same thermal history, and 3. a third mechanism for sequentially transporting, without causing any contamination of the wafers, the wafers loaded on the boat and discharged out of said space containing high temperature thermal diffusion atmosphere to a predetermined position.

As described elsewhere in conjunction with the prior art thermal diffusion apparatus, the automation of a thermal diffusion apparatus for use in the process for manufacturing semiconductor devices is extremely difficult, but in order to overcome this problem various novel and improved mechanisms and systems are incorporated in the thermal diffusion apparatus in accordance with the present invention shown in FIGS. 1 and 2 as will be described in detail hereinafter. First of all, each of the furnace tubes 2 is enclosed in a refractory ceramic material and surrounded with heating means so that the effective thermal diffusion temperature range of 1,150° C ± 50° C, where 1,150° C is a setting temperature, may be established and consequently the uniform thermal diffusion of dopants into the wafers 4 carried by the boats 3 may be attained during the time when they are transported from one end of the furnace tube 2 to the other end thereof.

Figure 3:
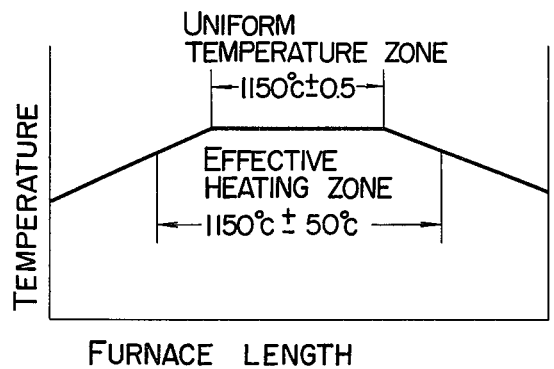
FIG. 3 is a view illustrating a temperature distribution or gradient in a diffusion furnace.

FIG. 3 shows the temperature distribution or gradient in the longitudinal direction of the prior art thermal diffusion furnace tube in which the temperature of the atmosphere is controlled with a relatively high degree of accuracy. From FIG. 3 it is seen that as compared with the well controlled uniform temperature zone of the prior art furnace, the effective heating zone provided by the present invention is considerably widened. In other words, the present invention enables the very effective use of the whole diffusion temperature zone in which the diffusion takes place. In the prior art diffusion furnaces, the wafers are held stationary at a predetermined position in the furnace so that only the uniform temperature zone shown in FIG. 3 can be used.

Figure 4A:
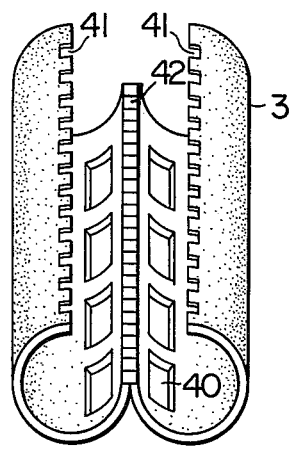
FIG. 4(a) is a perspective view of a wafer boat.
Figure 4B:
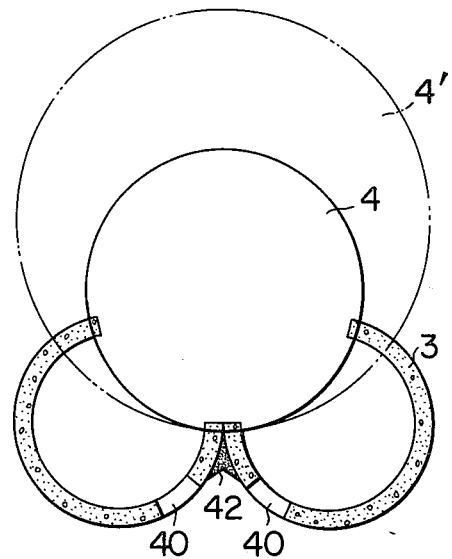
FIG. 4(b) is a sectional view thereof.
Figure 5:
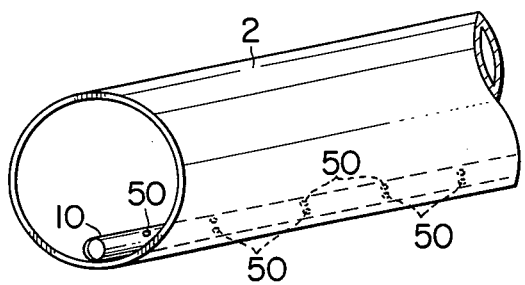
FIG. 5 is a fragmentary perspective view of a furnace tube in the diffusion furnace.

FIG. 4(a) is a perspective view of the wafer boat 3 while FIG. 4(b), a cross sectional view thereof. The boat 3 consists of a pair of quartz tubes each having an axially cutout portion are joined to each other along one side as indicated by 42 to have a cross sectional configuration similar to a numeral 3 as shown in FIG. 4(b) in order to minimize the sliding contact surface between the boat 3 and the furnace tube 2. A plurality of wafer supporting notches or slots 41 are formed along the other axial edge of the cutout of each tube. When the boat 3 is transported through the furnace tube 2, it is guided by a right rail or gas distribution pipe 10 (See FIGS. 5 and 6) which is laid in the furnace tube 2 and provided with a plurality of axially and circumferentially spaced gas outlet ports 50 as best shown in FIG. 5. The wafer boat 3 is therefore provided with two rows of axially spaced rectangular shaped gas inlet ports 40 for alignment with the gas outlet ports 50 of the gas distribution pipe or guide rail 10 in the furnace tube 2 so that gas discharged out of the gas outlet ports 50 may smoothly flow into the boat 3 through the inlet ports 40.

The wafer boat 3 may be modified as shown in FIG. 4(b) so as to be able to carry both sizes of wafers indicated by the solid line 4 and a slightly larger wafer 4 indicated by the broken lines.

Figure 6:
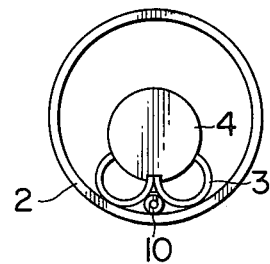
FIG. 6 is a side view thereof with a wafer boat inserted therein.

In FIGS. 5 and 6, there is shown the furnace tube 2. As described above, the pipe-shaped guide 10 is laid along the axis of and at the bottom of the furnace tube 2 in order to guide the wafer boat 3 which is transported through the tube 2. The dimensions of the gas discharge or outlet ports 50 are suitably changed so that the flow rate of the atmosphere may be uniform throughout the whole length of the furnace tube 2. In this embodiment, an oxygen atmosphere is used in order to form a desired oxide film over the surfaces of each wafer 4. The wafer boat 3 which is transported through the furnace tube 2 and guided by the guide rail 10 is best shown in FIG. 6.

In order to specifically point out the advantages of the present invention over the prior art some data for comparison are given in TABLE 1.

TABLE 1

|  | Prior Art | Invention |
| --- | --- | --- |
| variation in layer resistance | 20% (3 σ/mean value) | 8% |
| variation in diffusion thickness | 14% (3 σ/mean value) | 4% |
| wafer processing capacity | 1 | 1.9 |
| effective furnace length, (length of effective temperature zone/ whole length of heater) | 0.21 | 0.50 |

In the apparatus in accordance with the present invention, the effective heating zone which is wider than that of the prior art apparatus was used as shown in FIG. 3.

Three basic mechanism which constitute this invention are explained hereafter.

As described, the first mechanism of the thermal diffusion apparatus in accordance with the present invention is adapted to transport a plurality of wafer boats each carrying a predetermined number of wafers to be treated without causing any contamination and breakage thereof to the inlet or entrance of a high temperature thermal diffusion zone. The first mechanism in the boat stocker 9b shown in FIGS. 1 and 2, which must meet the following requirements:

i. a member or portion which is made into contact with the wafer boats made of quartz or the like may be cleaned with hydrogen fluoride in order to prevent the contamination of wafers, and, for this purpose, it must be readily removable for cleaning.

ii. the first mechanism is in such a construction as to permit the smooth transfer of the wafer boats and further free from breakage of the wafers.

The first mechanism will be described in detail hereinafter with reference to FIG. 7(a) illustrating a top view thereof and to FIG. 7(b) illustrating a side view thereof. Guard rods 71a for preventing the wafer boats from falling off the transfer path, supporting rods 71b for supporting the wafer boats 3 when an oscillation type transfer device 72 is at rest as will be described in detail hereinafter, and wafer boat supporting rods 71c carried by the transfer device 72 are readily removable for a cleaning operation described above. The oscillation type transfer device 72 for transferring the wafer boats 3 consists of a motor 78 and an eccentric cam mechanism 79 driven by the motor 78 for moving the wafer boat supporting rods 71c along a predetermined arcuate path. When the boat 3 is brought over to a lift 75 made of, for instance Teflon and disposed at the inlet end of the furnace tube 2 by the repeated oscillation of the wafer boat supporting rods 71c, an air cylinder 73 is actuated to extend its externally threaded rod 74 in mesh with a gear 77 so that the latter is rotated and a vertical shaft 76 in mesh with the gear 77 is lifted. As a result, the lift 75 carried by the vertical shaft 76 is lifted to the loading position from which the wafer boat 3 is inserted into the furnace tube 2 by the pusher mechanism 6 (See FIGS. 1 and 2).

Figure 8A:
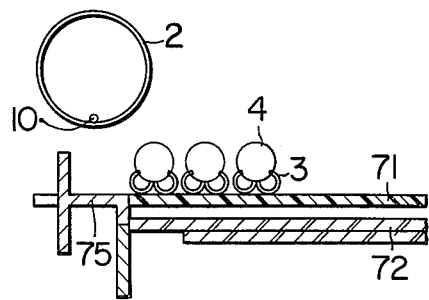
FIGS. 8(a), (b), (c), (d) and (e) are views used for the explanation of the mode of operation of an oscillation type transfer device of the first mechanism shown in FIGS. 7(a) and 7(b).
Figure 8B:
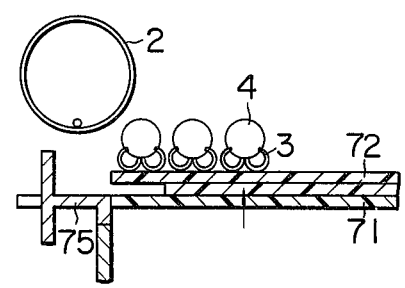
Figure 8C:
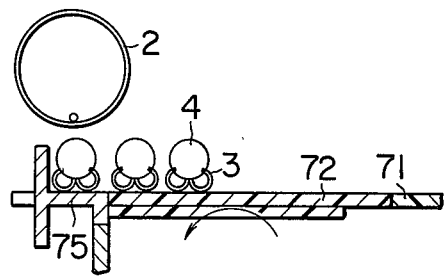
Figure 8D:
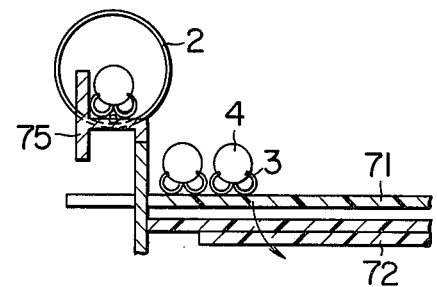
Figure 8E:
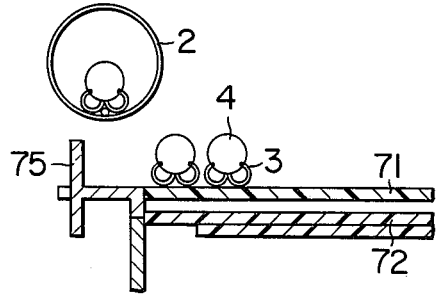

Next referring to FIGS. 8(a) through (e), the mode of operation of the oscillation type transfer device 72 will be described in detail. As shown in FIG. 8(a), three wafer boats 3 each carrying a plurality of wafers 4 are supported on the wafer boat supporting rod 71 made of Teflon or the like when the transfer device 72 is below the supporting rod 71. When the transfer device 72 is driven by the motor through the eccentric cam mechanism 79, in FIG. 7(a), it is moved upwardly along an arcuate path to lift the wafer boats 3 as indicated in FIG. 8(b). Thereafter the transfer device 72 is moved forwardly and downwardly along an arcuate path as indicated by the arrow in FIG. 8(c) so that the first boat 3 is placed over the lift 75. The transfer device 72 continues to move backwardly and downwardly along an arcuate path as indicated by the arrow in FIG. 8(d), leaving the second and third wafer boats 3 on the supporting rod 71 while the lift 75 is lifting the first wafer boat 3 toward the inlet end of the furnace tube 2. Thereafter both the transfer device 72 and the lift 75 are returned to the initial position as shown in FIG. 8(e), and the first wafer boat 3 is inserted into the furnace tube 2 by the pusher mechanism 6.

The first mechanism described above thus satisfies the conditions required for sequentially transferring the wafer boats 3 to the loading position from which each wafer boat 3 is inserted into the furnace tube 2, and has a construction which permits easy cleaning of the mechanism.

As described elsewhere, the second mechanism is adapted to sequentially transport the wafer boats through the furnace tube 2 from the inlet end to the outlet end so that each of the wafers carried by the boats 3 may undergo the substantially same heat-treatment or diffusion process.

The second mechanism is therefore the pusher mechanism 6 shown in FIGS. 1 and 2, and will be described in detail with reference to FIGS. 9(a), (b) and (c).

In general, the pusher mechanism 6 comprises a pulse or stepping motor 91 driven in response to the driving pulses from a pulse generator (not shown), the rotational speed of the stepping motor 91 being variable within a predetermined range, a nut 98 carried movably by 96 and made into a threading engagement with a screw shaft 94 drivingly coupled through a pair of intermeshing gears 92 and 93 to the drive shaft of the pulse motor 91 and a pushing rod 95 carried by the nut 98 and having a pusher 97 made of polytetrafluoroethylene (P.T.F.E.) or the like and removably attached to the leading end of the pushing rod 95. The pusher mechanism 6 further comprises a quick return mechanism including limit switches 190 adapted to generate the output signals in response to which the pusher 97 inserts each wafer boat 3 into the furnace tube 2 at a low speed over a predetermined distance and then is returned to the initial position at a high speed, and an overload sensing mechanism 200 and 210 for generating an output signal when any of the wafer boats 3 in the furnace tube 2 are caught by or stick to the tube 2; that is, when the smooth movement of the wafer boats 3 in the furnace tube 2 is interrupted, thereby stopping the operation of the pusher mechanism 6 as will be described in detail hereinafter. The pusher 97 is displaced in parallel with the axis of the furnace tube 2.

Next the mode of operation of the pusher mechanism 6 will be described. When the wafer boat 3 is brought to the loading position by the lift 75 in front of the pusher 97 made of an acid-resisting material such as P.T.F.E. and made into releasable threading engagement with the pusher rod 95 at the leading end thereof, the pulse motor 91 is energized in response to the output signal from an optical sensor means including a phototube or the like for detecting whether the wafer boat 3 is located at the loading position or not, and accordingly the rotation of the pulse motor 91 is transmitted through the intermeshing gears 92 and 93 to the shaft 94. As a result, the nut 98 and hence the pushing rod 95 is displaced toward the furnace tube 2 so that the boat 3 is inserted into the tube 2 by the pusher 97 at a low speed. When the pusher 97 inserts the wafer boat 3 into the furnace tube 2, the limit switch 190 is actuated to generate the output signal in response to which the pulse motor 91 is reversed in direction and is rotated at a high speed so that the pusher mechanism 6 is returned to the initial position at a high speed. In like manner, the next wafer boat 3 is inserted into the furnace tube 2 in such a way that the leading end of the next wafer boat 3 is made into contact with the trailing end of the preceding wafer boat 3. Therefore the wafer boats 3 are intermittently transported through the furnace tube 2 at a predetermined speed.

Next the overload sensing mechanism will be described in detail. As described elsewhere, the wafer boat 3 is made of quartz or the like and has a cross sectional configuration similar to the fallen flatten numeral 3 (or to ω (omega), in order to provide the line contact with the furnace tube 2, thereby minimizing the frictional resistance as much as possible. Therefore the overall frictional resistance encountered from a plurality of wafer boats 3 transported through the furnace tube 2 may be minimized so that the pulse motor 91 with a relatively small capacity may be used and the force encountered by the pusher mechanism 6 from the wafer boats 3 in the furnace tube 2 may be minimized. However, very fine quartz particles are inevitably formed and accumulated in the furnace tube 2 by the abrasive action between the wafer boats 3 and the furance tube 2 so that when these particles are melted to stick to the wafer boats 3 the smooth transfer thereof through the furnace tube 2 is adversely affected. To overcome this problem, the overload sensing mechanism is provided comprising a disk 210 carried by the drive shaft of the pulse motor 91 and provided with grooves or recesses formed at the surface and a sensor 200. The sensor 200 is adapted to count the number of the recesses of the disk 210 rotating in synchronism with the pulse motor 91 and converts the number of recesses which have passed through the sensor 200 into the electrical pulse signals. When the number of pulse signals counted within a predetermined time interval is less than a reference number, the smooth transportation of wafer boats 3 through the furance tube 2 is considered to be interferred with by some cause so that the pulse motor 91 is immediately stopped in response to the output signal from the overload sensing mechanism.

The overload sensing mechanism described above is of the electro-magnetic type. Alternatively, an optical-electric sensor system may be used, that is, the disk 210 has a slotted periphery, and a light source and an optical sensor are disposed on the opposite sies of the disk 210 in such a way that the light from the light source which is intermittently transmitted through the slots of the disk may be intercepted by the optical sensor.

Figure 9C:
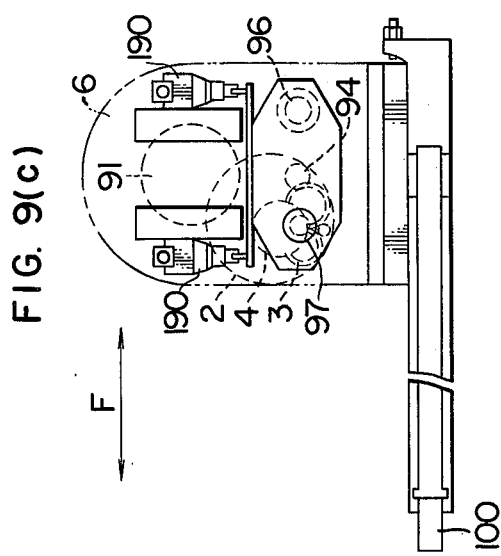
FIG. 9(c) is a front view thereof.
Figure 9A:
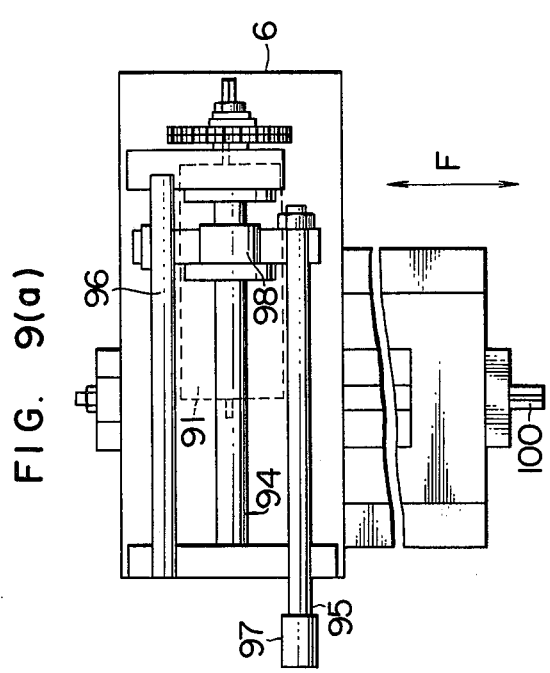
FIG. 9(a) is a top view of a second mechanism or pushing device for inserting a wafer boat into the furnace tube and pushing the wafer boats so that it is transported at a constant speed through the furnace tube.

In order to measure the temperature distribution or gradient within the furnace tube 2 with a long thermocouple sealed in a glass envelop, an externally threaded screw shaft 100 is rotated so that the pusher mechanism 6 may be displaced away from the furnace tube 2 as indicated by the arrow F in FIG. 9(c) and the long thermocouple may be readily inserted into the furnace tube 2 without the interference with the pusher 97.

Figure 10A:
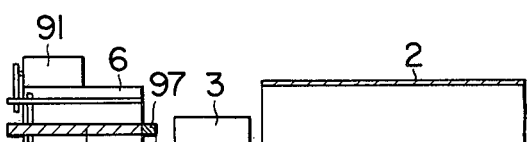
FIGS. 10(a) through 10(f) are views used for the explanation of the mode of operation of the second mechanism or pushing device shown in FIG. 9.
Figure 10B:
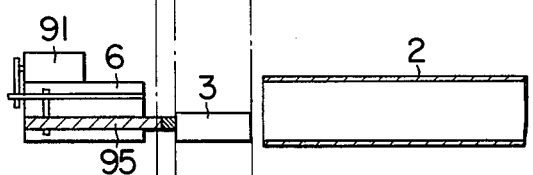
Figure 10C:
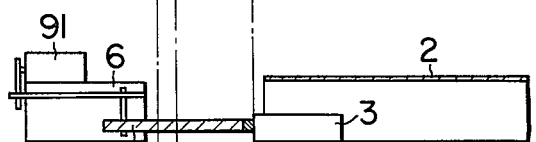
Figure 10D:
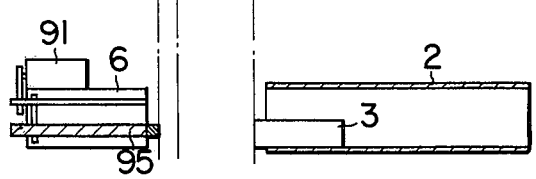
Figure 10E:
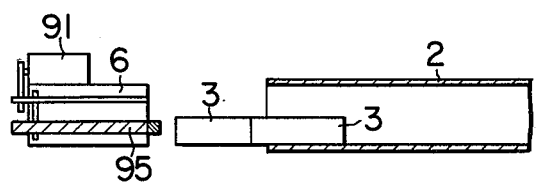
Figure 10F:
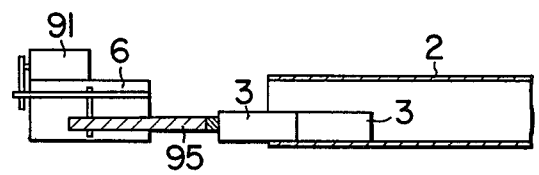

Next referring further to FIGS. 10 and 11, the mode of operation of the pusher mechanism 6 will be described. In the first step, as shown in FIG. 10(a) the first wafer boat 3 with a length b is brought to the loading position by the lift 75 and is spaced apart from the leading end of the pushing rod 95 by a distance a, and then the pushing rod 95 is displaced over the distance a into contact with the wafer boat 3 at a high or quick feed speed A shown in FIG. 11. Thereafter at a low speed B indicated in FIG. 11 the pushing rod 95 inserts the wafer boat 3 over the distance b into the furnace tube 2 as shown in FIG. 10(c) so that the wafers carried by the wafer boat 3 may undergo a uniform diffusion step. Then the limit switch 190 is actuated to generate the output signal in response to which the pushing rod 95 is returned to the initial position as shown in FIG. 10(d) over the distance (b+a) at a high speed A, and then the next wafer boat 3 is brought to the loading position as shown in FIG. 10(e) and is inserted into the furnace tube 2 in the same manner as described above and in such a way that the leading end of the next wafer boat may be made into contact with the trailing end of the preceding wafer boat. In like manner, the wafer boats 3 are sequentially inserted into the furnace tube 2 and transported therethrough at a low or diffusion speed B so that they may undergo an uniform diffusion step to maintain the same thermal history.

Figure 11:
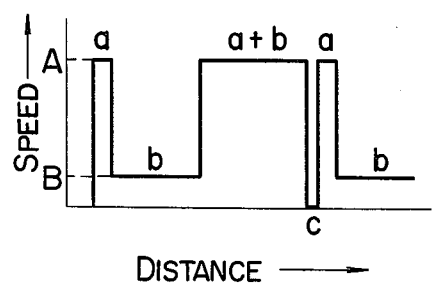
FIG. 11 shows a sequence of motions of a pushing rod of the second mechanism.

FIG. 11 is a distance vs. speed of the pushing rod 95 of the pusher mechanism 6. The pushing rod 95 is displaced over the distance a and the distance (a + b) at a high or quick-feed and quick-return speed A. For instance, in this embodiment the rotational speed from 100 to 1,000 pulses per second of the pulse motor 91 is translated through the intermeshing gears 92 and 93 and the nut 98 in mesh with the screw shaft 94 into the linear speed of 13.3 to 133 millimeters per minute of the pushing rod 95.

The wafer boats 3 are intermittently transported through the furnace tube 2 at a low speed B. For instance, in this embodiment the oscillation of the pulse generator is varied to generate the driving pulses for rotating the pulse motor at a rate of 0.5 to 5 pulses per second so that the pushing rod 95 may be displaced at low speed from 0.66 to 6.6 millimeters per minute. Thus a high speed A is suitably varied over the range between 13.3 and 133 millimeters per minute while a low speed B, within the range between 0.66 and 6.6 millimeters per minute.

Next the important advantages brought about by this mechanism 6 will be described below.

1. The speed of the wafer boats 3 transported through the furnace tube 2 is determined dependent upon a desired diffusion time and temperature and is suitably selected over a very low speed range between 0.66 and 6.6 millimeters per minute. As opposed to the prior art diffusion furnaces in which the wafer boats are manually loaded into and unloaded from the high temperature diffusion atmosphere, the wafer boats 3 are transported through the furnace tube 2 at a predetermined speed which is highly stable so that the adverse effects on the wafers 4 due to the influence of thermal impact and the residual stress distributions may be minimized, and consequently the processed wafers may have uniform electrical characteristics.

2. In order that the wafers may undergo a uniform thermal diffusion process, the speed of the wafer boats 3 transported through the furnace tube 2 must always be maintained constant. As shown in FIG. 11, wafer boats 3 remain stationary in the furnace tube 2 during the time when the pushing rod 95 is displaced over the distance a and the distance (a + b) as described above, the distance c in FIG. 11 being a play or deviation of the pushing rod 95 from the initial position. However, the time interval required for the pushing rod 95 to move over these distances a and (a + b); that is, the time when the wafer boats 3 are at rest in the furnace tube 2 is negligible relative to the diffusion time. Therefore even though the wafer boats 3 have been described as being transported intermittently, it may be said that they are continuously transported through the furnace tube 2 at a practically constant speed.

3. The error in both low and high speeds (the former being from 0.66 to 6.6 millimeters per minute while the latter, from 13.3 to 133 millimeters per minute in this embodiment) is within ± 1% because the pulse motor 91 and a reduction gear mechanism including the nut and the screw shaft 94 are used. Such a very small error is permissible in practical operation.

4. In case of abnormal transportation of the wafer boats 3 through the furnace tube 2, the pusher mechanism 6 can be immediately de-energized in response to the output signal from the overload sensing mechanism.

Figure 9B:
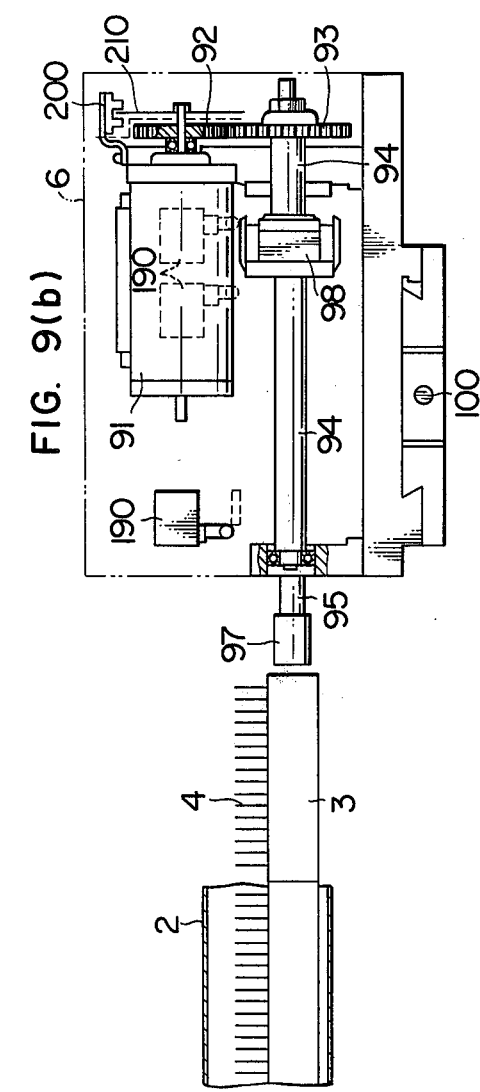
FIG. 9(b) is a side view thereof.
Figure 12:
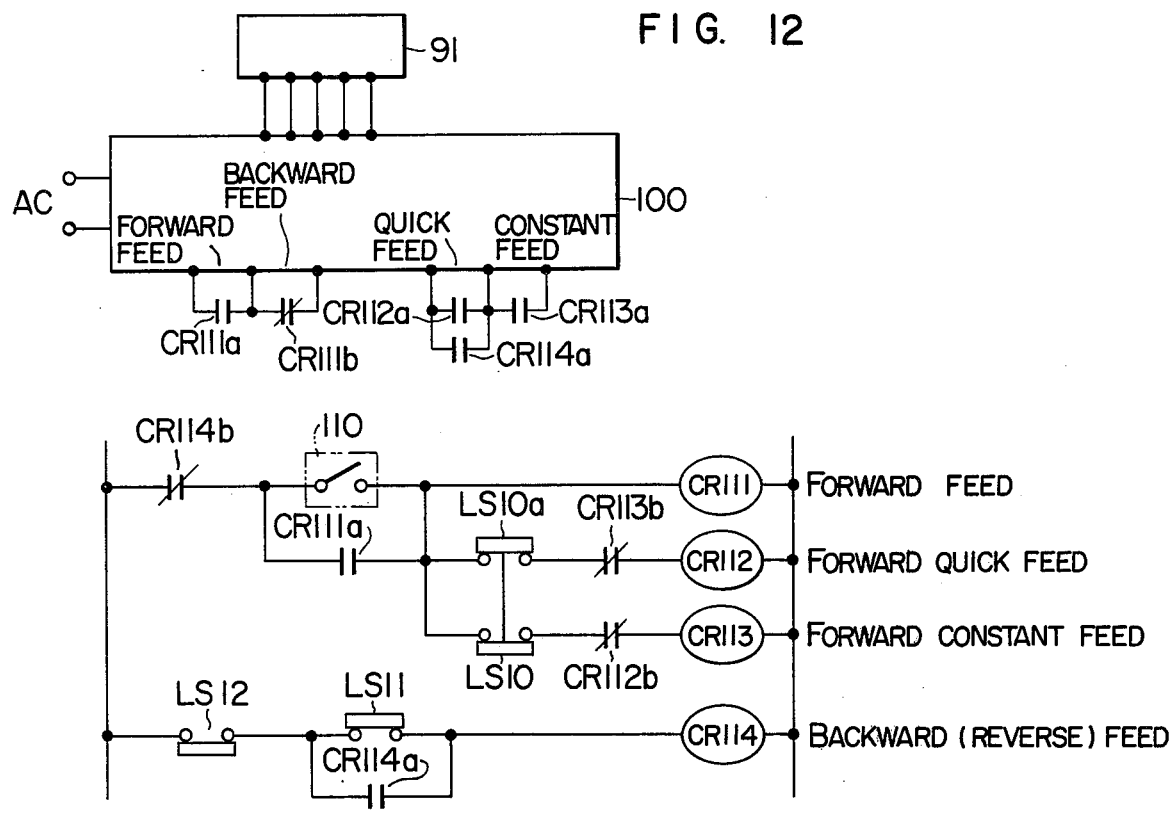
FIG. 12 is a diagram of a control circuit of the second mechanism.

Next with reference to FIG. 12 an electrical control circuit for controlling the operation of the pusher mechanism 6 will be described. The control circuit controls the pulse motor 91 in such a way that the pushing rod 95 is driven as shown in the sequence diagram of FIG. 11. A control circuit generally indicated by the reference numeral 100 in FIG. 12 is of the conventional type for controlling the pulse motor 91 in response to the input control pulses from relays to be described below. Relay coils CR 111, 112, 113 and 114 have relay contacts CR 111a, 112a, 113a and 114a and CR 111b, 112b, 113b and 114b which are so arranged and interconnected with each other that when the relay contacts CR 111a through 114a are closed or opened the relay contacts CR 111b through 114b are opened or closed. Limit switches LS10, LS11, and LS12 correspond to the limit switches indicated by the reference numeral 190 in FIG. 9. The limit switch LS10 is actuated when the pushing rod 15 is displaced forwardly over the distance a as shown in FIG. 10(b) while the limit switch LS11 is actuated when the pushing rod 95 is further displaced forwardly over the distance (a + b) as shown in FIG. 10(c). The limit switch LS12, which is normally closed, is actuated when the pushing rod 95 is returned to the initial position as shown in FIG. 10(d).

Next the mode of operation of the control device will be described. In response to the output signal from the sensor or phototube for detecting the wafer boat 3 brought to the loading position in the manner described above as shown in FIG. 10(a), a switch 110 is closed to energize the relay coil CR 111 so that the forward drive signal is applied to the pulse motor control circuit 100. Then the relay contacts CR 111a are closed so that the current flows through the limit switch 10a and the relay contacts CR 113b to energize the relay coil CR 112 so that the forward, quick feed signal is applied to the control circuit 100. When the pushing rod 95 is advanced over the distance a as shown in FIG. 10(b), the limit switch LS10 is closed while the limit switch LS10a is opened so that the relay coil CR 112 is de-energized while the relay coil CR 113 is energized and consequently the forward, constant or low speed signal is applied to the control circuit 100. Then the pushing rod 95 is advanced over the distance (a + b) as shown in FIG. 10(c) so that the limit switch LS11 is closed. As a result the relay coil CR 114 is energized to close the relay contacts CR 114a and to open the relay contacts CR 114b so that the reverse, quick return signal is applied to the pulse motor control circuit 100. Then the pushing rod 95 is quickly returned to the initial position as shown in FIG. 10(d) and the limit switch LS12 is opened so that the reverse quick return signal disappears. The control sequence described above is cycled whenever the phototube detects the presence of the wafer boat 3 on the loading position, whereby the wafer boats 3 are sequentially inserted into and transported through the furnace tube 2 in the manner described above.

The third mechanism is adapted, as described hereinbefore, to sequentially transport the wafer boat 3 discharged from the furnace tube 2 or higher temperature thermal diffusion atmosphere zone to a predetermined position without causing an contamination and breakage of the processed wafers 4. The third mechanism is therefore the boat stocker 9a in FIGS. 1 and 2.

The third mechanism will be described in detail with reference to FIG. 13(a) illustrating a top view thereof and FIG. 13(b), a side view thereof. When the wafer boat 3 is discharged out of the furnace tube 2 and is brought to the loading position, an optical sensor or phototube 126 generates an output signal in response to which an air cylinder 123 is actuated to extend a pusher 124 made of P.T.F.E. and attached to the rod of the air cylinder 123 so that the wafer boat 3 is transferred over the boat stocker 9a substantially similar in construction to the boat stocker 9b described in detail with reference to FIG. 7. Therefore the wafer boat 3 which has been transferred over the boat stocker 9a is transported to a predetermined position by the oscillation type transfer device 72.

Figure 14A:
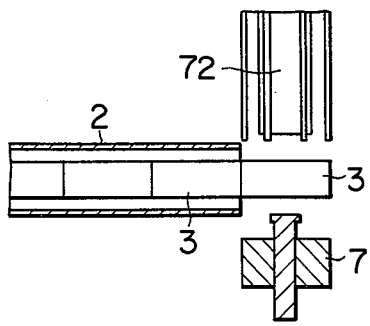
FIGS. 14(a), (b), (c) and (d) are views used for the explanation of the mode of operation of the third mechanism shown in FIG. 13.
Figure 14B:
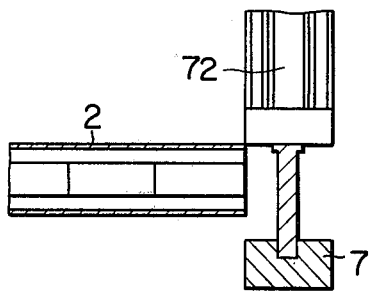
Figure 14C:
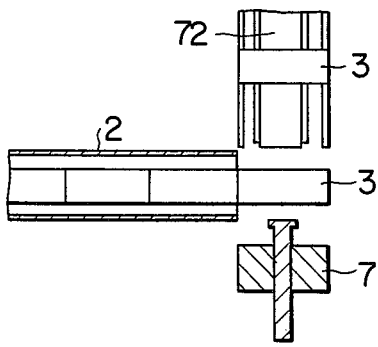
Figure 14D:
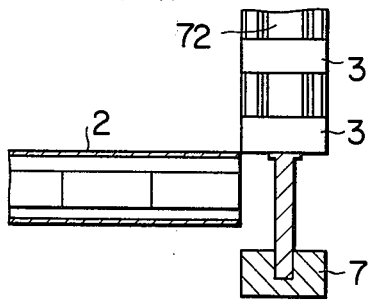

Next referring further to FIG. 14, the mode of operation of the third mechanism will be described in more detail. As shown in FIG. 14(a) the wafer boat 3 which has passed through the furnace tube 2 is brought to the loading position in front of the loading device 7 consisting of the air cylinder 123 and the pusher 124, and is detected by the phototube 126. In response to the output signal from the phototube 126, the loading device 7 is actuated in the manner described above to transfer the wafer boat 3 over the oscillation type transfer device 72 as shown in FIG. 14(b). Thereafter the loading device 7 is returned to the initial position as shown in FIG. 14(c), and transfers the next wafer boat 3 over the transfer device 72 as shown in FIG. 14(d).

As described above, according to the present invention a plurality of wafer boats each carrying a predetermined number of wafers to be processed are sequentially inserted into an inlet end of a high temperature, thermal diffusion atmosphere zone or furnace tube and are continuously transported therethrough at a constant speed to be discharged sequentially out of an outlet end of the diffusion zone or furnace tube so that the wafers carried by the wafer boats may be uniformly diffused and consequently the variation in characteristics of the processed wafers may be minimized to such a degree hitherto unattainable by the prior art thermal diffusion methods and apparatus. The electrical characteristics of the processed wafers are dependent upon the heat-treatment or thermal history they experienced during the time when they were transported through the thermal diffusion atmosphere zone or furnace tube. Therefore according to the present invention the diffusion temperature to be maintained in a diffusion furnace may have more wide range of tolerance than the diffusion temperature in the prior art diffusion furnaces wherein the wafers to be processed are held stationary. As a result, a wide temperature range which cannot be used in the prior art thermal diffusion methods and apparatus can be advantageously used in the method and apparatus in accordance with the present invention. Furthermore the ratio of the effective length of a diffusion furnace to the overall length thereof may be remarkably improved, and since the wafers to be processed are continuously transported during the diffusion process, a downtime of a diffusion apparatus in accordance with the present invention can be considerably reduced. A further advantage of the present invention is that the transfer devices 9a and 9b, the pusher mechanism 6 and the loading device 7 are located outside of the furnace tubes 2 so that their breakage due to the high temperature, diffusion atmosphere can be eliminated.

What is claimed is:

1. A thermal diffusion apparatus for use in fabricating semiconductor devices comprising:
   a furnace tube which is so controlled as to have a predetermined temperature distribution or gradient,
   gas supply means laid in said furnace tube axially thereof for introducing a diffusion gas into said furnace tube through a plurality of gas outlets to provide a predetermined diffusion atmosphere,
   a plurality of boats each of which is made of a refractory material and is adapted to carry a number of wafers to be processed in said furnace tube, and
   pushing means for pushing said plurality of boats in contact with the adjacent boats from an inlet end to an outlet end of said furnace tube, said gas supply means functioning as a guide rail so that said boats are guided by said gas supply means from said inlet end to said outlet end when they proceed in said furnace tube.

2. A thermal diffusion apparatus as set forth in claim 1 wherein said pushing means is disposed in a clean chamber with which said inlet end of said furnace tube is communicated airtightly.

3. A thermal diffusion apparatus as set forth in claim 2 wherein said pushing means disposed in said clean chamber includes transfer means for sequentially transferring said plurality of boats to a predetermined position from which each boat is inserted into said furnace tube.

4. A thermal diffusion apparatus as set forth in claim 1 wherein said pushing means includes a pushing rod for inserting each boat into said furnace tube and causing said plurality of boats to move at a substantially constant speed through said furnace tube, and a control device for driving said pushing rod.

5. A thermal diffusion apparatus as set forth in claim 4 wherein said control device includes:
   a pulse motor,
   pulse motor control means for driving said pulse motor in accordance with a predetermined control pattern after having detected the arrival of each boat at a position where each boat is inserted into said furnace tube, and
   means for converting the rotation of said pulse motor into the linear reciprocal motion of said pushing rod of said pushing means.

6. A thermal diffusion apparatus as set forth in claim 2 wherein said plurality of gas outlets of said gas supply means have different dimensions from each other in such a way that the diffusion gas may be uniformly distributed throughout said furnace tube.

7. A thermal diffusion apparatus as set forth in claim 1 wherein each boat is formed with an engaging member for engagement with said gas supply means so as to be guided by it and a plurality of holding means each of which is adapted to hold each wafer at three points.

8. A thermal diffusion apparatus as set forth in claim 2 wherein said pushing means includes:
   a pushing rod for inserting each boat into said furnace tube and causing said plurality of boats to move through said furnace tube, and
   a control device for driving said pushing rod.

9. A thermal diffusion apparatus as set forth in claim 8 wherein said control device includes:
   a pulse motor, pulse motor control means for driving said pulse motor in accordance with a predetermined control pattern after having detected the arrival of each boat at a position where each boat is inserted into said furnace tube, and means for converting the rotation of said pulse motor into the linear reciprocal motion of said pushing rod of said pushing means.

10. A thermal diffusion apparatus for heat-treating semiconductor wafters comprising:

a furnace tube for receiving a diffusion gas to provide a predetermined gaseous atmosphere therein;

a plurality of boats each of which is adapted to carry a number of wafers to be heat-treated in said furnace tube;

guide rail means laid in said furnace tube axially thereof for guiding said boats from the inlet to the outlet of said furnace tube;

a clean chamber airtrightly communicated with said inlet of said furnace tube;

transfer means positioned in said clean chamber for sequentially transferring said plurality of boats to a predetermined position adjacent said inlet of said furnace tube from which each boat is inserted into said furnace tube; and pushing means positioned in said clean chamber for sequentially pushing said plurality of boats from said predetermined position in said clean chamber into said inlet of said furnace tube, whereby said plurality of boats are moved through said furnace tube, contacting with each other.

11. A thermal diffusion apparatus according to claim 10, wherein said guide rail means defines gas supply means positioned in said furnace tube and provided with a plurality of gas outlets having different dimensions from each other in such a way that the diffusion gas may be uniformly distributed throughout said furnace tube.

12. A thermal diffusion apparatus according to claim 10, wherein said pushing means includes:

a push rod;

an electric motor coupled to said push rod by means of gear means for moving said push rod axially during the rotation thereof; and a control circuit for controlling the rotation and the rotating direction of said electric motor.

* * * * *